(12) United States Patent
Mochida et al.

(10) Patent No.: US 6,502,738 B2
(45) Date of Patent: Jan. 7, 2003

(54) WIRE BONDING APPARATUS

(75) Inventors: Tooru Mochida, Tokyo (JP);
Yoshimitsu Terakado, Tokyo (JP);
Koichi Takahashi, Tokyo (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 27 days.

(21) Appl. No.: 09/727,000

(22) Filed: Nov. 30, 2000

(65) Prior Publication Data
US 2001/0002031 A1 May 31, 2001

(30) Foreign Application Priority Data
Nov. 30, 1999 (JP) .......................... 11-338884

(51) Int. Cl.⁷ .......................... B23Q 15/007
(52) U.S. Cl. .......................... 228/4.5; 228/11
(58) Field of Search .................. 228/4.5, 112.1, 228/8, 102, 103, 110.1, 180.5, 1.1, 11

(56) References Cited

U.S. PATENT DOCUMENTS 4,572,421 A * 2/1986 Hug et al.
5,277,354 A * 1/1994 Farassat
5,526,975 A * 6/1996 Endo

FOREIGN PATENT DOCUMENTS

JP H7-283264 10/1995
JP 2513442 7/1996

* cited by examiner

Primary Examiner—Tom Dunn
Assistant Examiner—Jonathan Johnson
(74) Attorney, Agent, or Firm—Koda & Androlia

(57) ABSTRACT

A wire bonding apparatus comprising: a spool motor rotates a spool around which a wire is wound, a tension-applying device that is disposed beneath the spool, a wire pay-out sensor disposed away from a gas-jet-out side of the tension-applying device so as to sense that the supply of the wire is insufficient, a wire-end detection sensor disposed on the gas-jet-out side of the tension-applying device so as to sense that the supply of the wire from the spool has stopped, and a control device controls so that the spool motor is rotated by a predetermined fixed amount when the wire is sensed by the wire pay-out sensor.

3 Claims, 3 Drawing Sheets

WIRE BONDING APPARATUS

BACKGROUND OF THE INVENTION

1. Field of the Invention

The present invention relates to a wire bonding apparatus and more particularly to a wire pay-out control mechanism.

2. Prior Art

Conventional wire pay-out control mechanisms for wire bonding apparatuses are described in, for example, Japanese Patent Application Laid-Open (Kokai) No. H7-283264 and Japanese Utility Model Registration No. 2513442. In these structures, a tension-applying means that applies tension to the wire supplied to the capillary is provided at a point beneath the spool on which the wire is wound. Tension is applied to the wire by a gas that jets out from the tension-applying means, thus forming a bowed portion in the wire between the spool and the capillary.

In the above structures, a wire pay-out sensor is installed above the tension-applying means so as to be positionally apart from gas-jet-out side of the tension-applying means. When this wire pay-out sensor ceases to sense the wire, the spool is caused to rotate so as to pay-out the wire; and when the wire pay-out sensor senses the wire, the rotation of the spool is stopped. Furthermore, a wire-end detection sensor is disposed on the gas-jet-out side of the tension-applying means. When this wire-end detection sensor senses the wire, it is determined that the wire on the spool has been all consumed.

As seen from the above, in the above prior art, wire pay-out is initiated when the wire is moved away from the wire pay-out sensor. Accordingly, wire pay-out is frequently performed, resulting in that the pay-out of the wire becomes unstable. Furthermore, as a result of this and as a result of the fact that the spool is rotated and the wire is paid out until the wire pay-out sensor senses the wire, the wire tends to vibrate by the gas jetting out of the tension-applying means. Thus, there is a chance that erroneous sensing occurs. If such erroneous sensing occurs, the wire would be paid out more than it is actually necessary.

BRIEF SUMMARY OF THE INVENTION

Accordingly, the object of the present invention is to provide a wire bonding apparatus that can constantly pay out a fixed amount of the wire and prevent the wire from being paid out more than it is necessary. In the present invention, this is done not as a result of detection of the stopping of the pay-out of the wire from the spool but as a result of a constant wire-pay out whenever the amount of bowing of the wire in the area of the tension-applying means becomes insufficient.

The above object is accomplished by a unique structure of the present invention for a bonding apparatus, which comprises:

- a spool motor that causes the rotation of a spool around which a wire is wound,
- a tension-applying means disposed beneath the spool,
- a wire pay-out sensor that is disposed at a position away from the gas-jet-out side of the tension-applying means and senses that the wire supply is insufficient,
- a wire-end detection sensor disposed on the gas-jet-out side of the tension-applying means and senses that the supply of the wire from the spool has stopped, and
- a control device that performs a control action so that the spool motor is rotated by a predetermined fixed amount when the wire is sensed by the wire pay-out sensor.

In the above-described structure, the control device includes a quantum limit circuit into which a predetermined number of pulses are inputted; and when the start signal from the wire payout sensor is inputted into the quantum limit circuit, the quantum limit circuit outputs pulses that cause the spool motor to rotate, with these pulses being equal to the predetermined number of pulses.

DETAILED DESCRIPTION OF THE INVENTION

One embodiment of the present invention will be described with reference to FIGS. 1 through 3.

Figure 1:
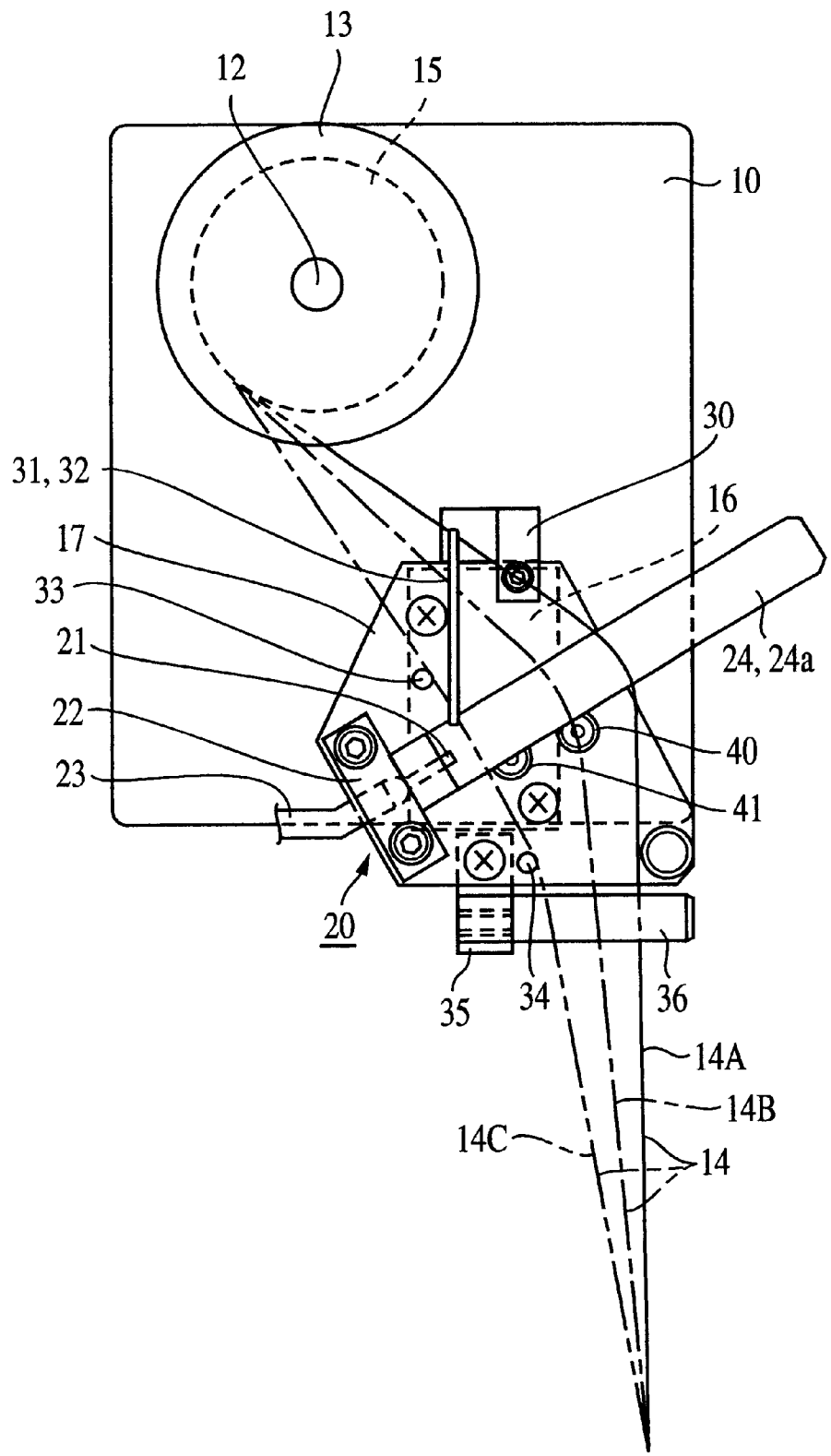
FIG. 1 is a front view of essential portions of one embodiment of the wire bonding apparatus according to the present invention.
Figure 2:
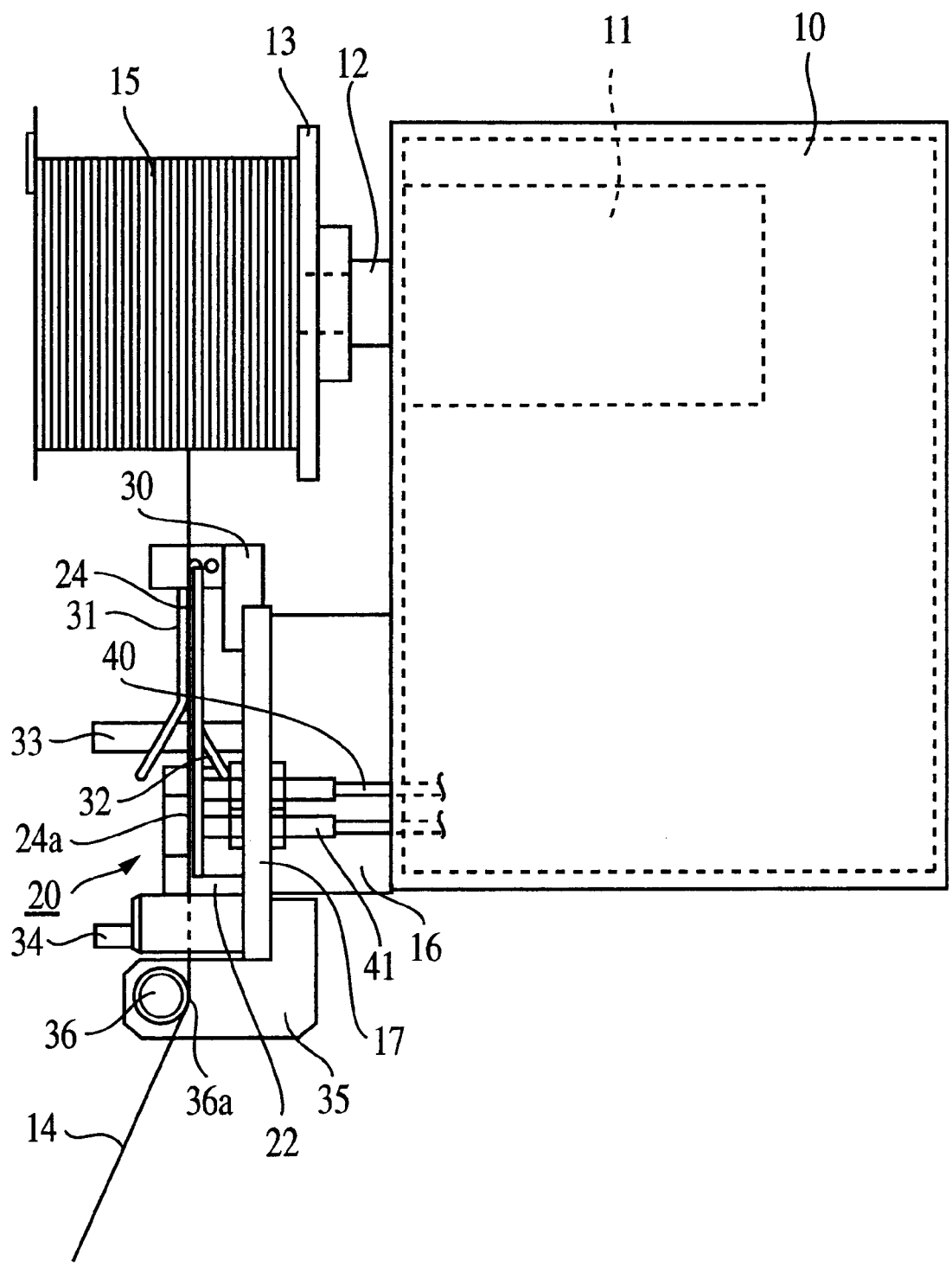
FIG. 2 is a side view of FIG. 1.

As shown in FIGS. 1 and 2, a spool motor 11 is fastened to a box 10 which is mounted to a wire bonding apparatus (not shown), and a spool shaft 12 is fastened to this spool motor 11. A spool holder 13 is coupled to the spool shaft 12, and a spool 15 on which a wire 14 is wound is detachably fitted on the spool holder 13. Furthermore, a plate 17 is fastened to the box 10 via a block 16 in the area beneath the spool shaft 12, and a tension-applying means 20 that applies tension to the wire 14 is provided on this plate 17.

In the tension-applying means 20, a nozzle 21 that blows a gas onto the wire 14 is fastened to a nozzle holder 22, which is fixed to the plate 17, so that the nozzle 21 is inclined upward. A pipe 23 for supplying the gas is connected to the opposite side of the nozzle 21, and this pipe 23 is communicated with a gas supply source such as a compressor (not shown), etc. that supplies a gas such as air, an inert gas, etc. Furthermore, a gas guide plate 24 that is installed along the direction of flow of the gas that is caused to jet out of the nozzle 21 is fastened to the nozzle 21.

A holder 30 is fixed to the upper part of the plate 17, and a pair of wire guide pins 31 and 32 are fastened to the holder 30. These wire guide pins 31 and 32 extend toward the gas guide surface 24a of the gas guide plate 24. The wire guide pins 31 and 32 are disposed so that they are located on both sides of the (imaginary) center line extended from the nozzle 21 with certain spaces in between, and such pins are on a plane that is parallel to the plane of the gas guide surface 24a. Furthermore, as best seen from FIG. 2, the pins 31 and 32 open in a V shape at the lower end in order to facilitate insertion of the wire 14. Wire stoppers 33 and 34 are fastened to both sides of the gas guide plate 24 in a perpendicular attitude so that these wire stoppers 33 and 34 face the nozzle 21.

A block 35 is secure to the lower end of the plate 17, and a wire guide rod 36 is attached to this block 35 so that the wire guide rod 36 is parallel to the plane of the gas guide surface 24a of the gas guide plate 24. The side surface part 36a (see FIG. 2) of the wire guide rod 36 forms a surface that is in the same plane as the side surface part 31a of the wire guide pin 31 and is parallel to the gas guide surface 24. The wire guide rod 36 is not limited to a rod-form member. The guide rod 36 can be a wire, sheet metal, etc.

The structure described above is the same as that of a conventional wire bonding apparatus, and the feature of the present invention will be described below.

A wire pay-out sensor 40 and a wire-end detection sensor 41 both consisting of fiber sensors, etc. are fastened to the above-described plate 17. The wire pay-out sensor 40 does not sense the stopping of the pay-out of the wire 14 as in conventional apparatuses; instead it outputs a start signal 40*a* that is used to cause the pay-out of a fixed amount of wire 14 by causing the spool motor 11, i.e., the spool 15, to rotate by a fixed amount. As in conventional apparatuses, the wire-end detection sensor 41 outputs a stop signal 41*a* in cases where the wire 14 runs out on the spool 15, or in cases where the wire 14 becomes entangled in the spool 15 and the wire cannot be fed out.

In the above structure, the wire 14 paid out from the spool 15 passes between the pair of wire guide pins 31 and 32 and further passes over the gas guide surface 24*a* of the gas guide plate 24, so that the wire 14 faces the nozzle 21. The wire then comes into contact with the guiding side surface 36*a* of the guide rod 36 and is pulled downward. The wire 14 that is thus pulled downward passes through a wire guide, wire clamper, etc. (not shown) and is then passed through a capillary (not shown).

Figure 3:
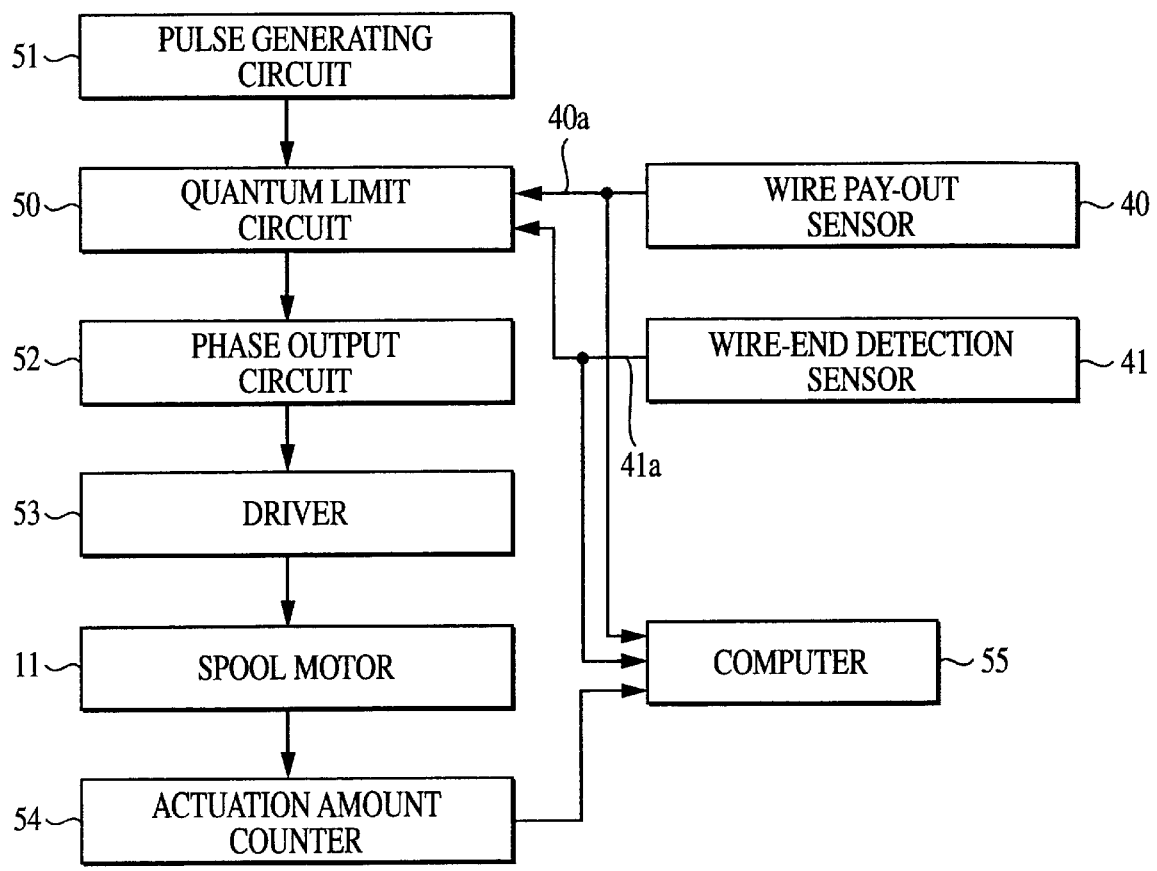
FIG. 3 is a block diagram of the control device use in the present invention.

FIG. 3 illustrates the control device used in the present invention.

This device is arranged so that the start signal 40*a* of the wire pay-out sensor 40 and the stop signal 41*a* of the wire-end detection sensor 41 are inputted into a quantum limit circuit 50. The quantum limit circuit 50 has a timer such as a pulse counter, etc.; and time pulses with a fixed period that serve as a time count source are inputted beforehand from a pulse generating circuit 51. When the start signal 40*a* from the wire-end detection sensor 40 is inputted into the quantum limit circuit 50, the quantum limit circuit 50 initiates the timer operation and outputs driving pulses that are used to cause rotation of the spool motor 11 to a phase output circuit 52. The phase output circuit 52 causes these pulses to be inputted into the spool motor 11 via a driver 53. Then, when the total number of clock pulses inputted into the quantum limit circuit 50 reaches a predetermined number of pulses, the timer operation is stopped, and the output of driving pulses to the phase output circuit 52 is stopped. Thus, the rotation of the spool motor 11 is stopped.

Furthermore, if a stop signal 41*a* is inputted into the wire-end detection sensor 41 during the timer operation of the quantum limit circuit 50, the timer operation of the quantum limit circuit 50 is stopped. The rotational pulses of the spool motor 11 are inputted into an actuation amount counter 54. A computer 55 judges the state of the wire 14 by calculating the amount of wire 14 consumed according to the count value of the actuation amount counter 54 and by reading in the states of the wire-end detection sensor 41 and wire pay-out sensor 40.

The operation of the above-described embodiment will be described below.

In FIG. 1, when a gas is being jetted out from the nozzle 21, the wire 14 is ordinarily in the state 14A shown by the solid line. When the wire 14 is consumed by a bonding operation, or when (a certain amount of) the wire 14 is paid out as a result of the movement of the capillary (not shown) in the X and Y directions, the wire 14 assumes the state 14B indicated by the one-dot chain line; and when the wire pay-out sensor 40 senses the wire 14, the spool motor 11 is caused to rotate by a predetermined number of pulses, so that the wire is paid out, thus putting the wire 14 in the state 14A indicated by the solid line.

This operation will be described further with reference to FIG. 3.

When the wire pay-out sensor 40 senses the wire 14 as described above, a start signal 40*a* is inputted into the quantum limit circuit 50 from the wire pay-out sensor 40, and the quantum limit circuit 50 therefore initiates the above-described timer operation and outputs driving pulses to the phase output circuit 52. As a result, the spool motor 11 is rotated via the driver 53, and the wire 14 is paid out. Then, when the quantum limit circuit 50 completes the timer operation, the phase output circuit 52 stops the rotation of the spool motor 11 via the driver 53.

If the wire 14 runs out on the spool 15 during the operation of the bonding apparatus, the wire 14 is sensed by the wire pay-out sensor 40, and the wire 14 is not paid out even if a signal that rotates the spool motor 11 is inputted. When the wire 14 is sensed by the wire-end detection sensor 41 while the wire is shifted from the state 14B indicated by the one-dot chain line to the state 14C indicated by the two-dot chain line, it is judged that there is no wire on the spool 15. As a result, the apparatus is stopped by the computer 55.

The wire 14 is ordinarily consumed during the operation of the apparatus; accordingly, wire pay-out is performed for at least once in several times of bonding actions in accordance with the wire length that is bonded. Accordingly, the count value of the actuation amount counter 54 that counts the number of rotations of the spool motor 11 is constantly updated. However, a case occurs where, for instance, the wire 14 is for some reason (e.g., slipping of the wire 14 from the wire guide, etc.) not sensed by the wire pay-out sensor 40 and the spool motor 11 does not rotate. In such a case, an upper limit is set on the number of wires bonded, and when the count value of the actuation amount counter 54 is not updated even though wire bonding is performed in excess of this set number, the pay-out of the wire is judged to be abnormal, and the apparatus is stopped. In other words, the upper limit on, for instance, the length of wire to be bonded is set beforehand for the case in which the spool motor 11 does not rotate due to the sensing failure of the wire pay-out sensor 40, to functioning failure of the spool motor 11, or to some other reasons. With this upper limit setting, the length of wire consumed for bonding at the time when the wire spool motor 11 stops is returned to be 0 (zero) mm; and if the total amount of wire consumed exceeds the upper limit in the next wire bonding, it is judged that abnormality has occurred in wire pay-out and the apparatus is stopped.

As seen from the above, the wire bonding apparatus of the present invention includes: a spool motor that rotates a spool around which a wire is wound, a tension-applying means which is disposed beneath the spool, a wire pay-out sensor which is disposed in a position away from the gas-jet-out side of the tension-applying means and senses that the wire supply is insufficient, a wire-end detection sensor which is disposed on the gas-jet-out side of the tension-applying means and senses that the supply of the wire from the spool has stopped, and a control device which performs a control action so that the spool motor is rotated by a predetermined fixed amount when the wire is sensed by the wire pay-out sensor. Accordingly, a fixed amount of the wire is constantly paid out when the amount of bowing of the wire in the area of the tension-applying means has become insufficient; and such a constant pay-out of wire is not as a result that the stopping of the pay-out of the wire from the spool is detected. Accordingly, the pay-out of wire is stable, and the wire is prevented from being paid out more than it is necessary.

Ordinary sensors may be used as the wire pay-out sensor and wire-end detection sensor used in the present invention.

There is, therefore, no need to use special sensors in which the light-emitting axis is disposed in the center and a plurality of light-receiving axes are disposed around the periphery. Accordingly, the cost of the apparatus is reduced.

What is claimed is:

1. A wire bonding apparatus comprising:

a spool motor that causes a spool around which a wire is wound to rotate, a tension-applying means disposed beneath said spool, said tension-applying means comprising a gas-jet applied to said wire, a wire pay-out sensor means disposed in a position that is away from a gas-jet-out side of said tension-applying means, said wire pay-out sensor means for sensing that a wire supply is insufficient, a wire-end detection sensor means disposed on said gas-jet-out side of said tension-applying means, said wire-end detection sensor means for sensing that an absence of said wire on said spool and for stopping said spool motor, and a control device which performs a control action so that said spool motor is rotated by a predetermined fixed amount when a start signal is inputted by said wire pay-out sensor and performs a control action so that said spool motor is not rotated when an insufficient amount of said wire supply is sensed by said wire pay-out sensor means.

2. The wire bonding apparatus according to claim 1, wherein said control device is provided with a quantum limit circuit into which a predetermined number of pulses are inputted, and wherein when a start signal from said wire pay-out sensor is inputted into said quantum limit circuit, said quantum limit circuit outputs pulses that cause said spool motor to rotate, with said pulses being equal to said predetermined number of pulses.

3. The wire bonding apparatus according to claim 2, wherein said wire-end detection sensor means is coupled to said quantum limit circuit and said quantum limit circuit is prevented from outputting said pulses that cause said spool motor to rotate when either said wire pay-out sensor means senses that said wire supply is insufficient or said wire-end detection sensor means senses said absence of said wire on said spool.

* * * * *